(12) United States Patent
Reboa

(10) Patent No.: US 6,924,922 B2
(45) Date of Patent: Aug. 2, 2005

(54) MICRO-MIRROR DEVICE INCLUDING DIELECTROPHORETIC LIQUID

(75) Inventor: Paul F. Reboa, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/976,232

(22) Filed: Oct. 26, 2004

(65) Prior Publication Data

US 2005/0088767 A1    Apr. 28, 2005

Related U.S. Application Data

(62) Division of application No. 10/387,312, filed on Mar. 12, 2003, now Pat. No. 6,844,953.

(51) Int. Cl.$^7$ ............................................. G02B 26/00
(52) U.S. Cl. ..................... 359/296; 359/290; 359/900
(58) Field of Search .............................. 359/224, 290, 359/291, 295, 296, 900

(56) References Cited

U.S. PATENT DOCUMENTS

| | | |
|---|---|---|
| 4,093,534 A | 6/1978 | Carter et al. |
| 4,418,346 A | 11/1983 | Batchelder |
| 4,662,746 A | 5/1987 | Hornbeck |
| 4,956,619 A | 9/1990 | Hornbeck |
| 5,061,049 A | 10/1991 | Hornbeck |
| 5,083,857 A | 1/1992 | Hornbeck |
| 5,583,688 A | 12/1996 | Hornbeck |
| 5,629,790 A * | 5/1997 | Neukermans et al. ........ 359/198 |
| 5,745,281 A | 4/1998 | Yi et al. |
| 5,959,338 A | 9/1999 | Youngner et al. |
| 5,999,303 A * | 12/1999 | Drake .......................... 359/224 |
| 6,025,951 A | 2/2000 | Swart et al. |
| 6,195,478 B1 | 2/2001 | Fouquet |
| 6,201,629 B1 * | 3/2001 | McClelland et al. ......... 359/223 |
| 6,262,827 B1 * | 7/2001 | Ueda et al. .................. 359/224 |
| 6,323,834 B1 | 11/2001 | Colgan et al. |
| 6,323,989 B1 * | 11/2001 | Jacobson et al. ............ 359/296 |
| 6,359,757 B1 | 3/2002 | Mallary |
| 6,389,189 B1 * | 5/2002 | Edwards et al. .............. 385/18 |
| 6,392,785 B1 | 5/2002 | Albert et al. |

(Continued)

FOREIGN PATENT DOCUMENTS

EP           1457802      *  9/2004

(Continued)

OTHER PUBLICATIONS

Michael Pycraft Huges, "AC Electrokinetics: Applications for Nanotechnology", Seventh Foresight Conference on Molecular Nanotechnology, Nov. 30, 1999, pp. 1-16, retrieved from the Internet: [http://www.Foresight.org/Conferences/ MNT7/Papers/Hughes/].

(Continued)

Primary Examiner—Ricky D. Shafer

(57) ABSTRACT

A micro-mirror device includes a substrate having a surface, and a plate spaced from and oriented substantially parallel to the surface of the substrate such that the plate and the surface of the substrate define a cavity therebetween. A dielectrophoretic liquid capable of movement when an electrical signal is applied to the micro-mirror device is disposed in the cavity, and a reflective element is interposed between the surface of the substrate and the plate such that the reflective element is adapted to move between a first position and at least one second position. The dielectrophoretic liquid includes at least one compound selected from the group consisting of siloxanes and silanes substantially free of asymmetrical ether linkages.

21 Claims, 11 Drawing Sheets

U.S. PATENT DOCUMENTS

| | | | |
|---|---|---|---|
| 6,404,534 B1 | 6/2002 | Chin et al. | |
| 6,404,942 B1 | 6/2002 | Edwards et al. | |
| 6,408,878 B2 * | 6/2002 | Unger et al. | 137/597 |
| 6,445,489 B1 * | 9/2002 | Jacobson et al. | 359/296 |
| 6,538,801 B2 * | 3/2003 | Jacobson et al. | 359/296 |
| 6,727,873 B2 * | 4/2004 | Gordon et al. | 345/88 |
| 6,753,999 B2 * | 6/2004 | Zehner et al. | 359/296 |
| 6,844,953 B2 * | 1/2005 | Reboa | 359/224 |
| 2001/0024556 A1 | 9/2001 | Beguin et al. | |
| 2003/0012483 A1 | 1/2003 | Ticknor et al. | |
| 2003/0202265 A1 * | 10/2003 | Reboa et al. | 359/877 |
| 2004/0136048 A1 * | 7/2004 | Arango et al. | 359/296 |

FOREIGN PATENT DOCUMENTS

| | | |
|---|---|---|
| JP | 2001147385 | 5/2001 |
| WO | WO 0025160 | 5/2000 |
| WO | WO 0165292 | 9/2001 |
| WO | WO 02/099527 | 12/2002 |

OTHER PUBLICATIONS

A. Feinerman et al., "fast Micro-Mirrors With Large Angle Deflections", 25 pgs., retrieved from the Internet: [http://www.darpa.mil/mto/stab/kickoff/stab_vic.pdf].

Alexander Wolter, "Studies on a High-Resolution Spatial Light Modulator with Deformable Surface Profile of a Liquid Film for Optical Pattern Generation", Jan. 24, 2001, pp. 1-2, Abstract only.

Alexander Wolter et al., "Fabrication of the Moving Liquid Mirror (MLM) Spatial Light Modulator in a Standard CMOS-Process", SPIE vol. 4178 (2000), pp. 246-254.

Alexander Wolter et al., "The Moving Liquid Mirror (MLM) Spatial Light Modulator: Simulation and Measurement of the Optical Performance", MEMS-vol. 2, Micro-Electro-Mechanical Systems (MEMS) (2000), pp. 437-442.

H. Togo et al., "Multi-Element Thermo-Capillary Optical Switch and Sub-Naoliter Oil Injection for its Fabrication", 1999 IEEE, pp. 418-423.

Junghoon Lee et al., "Surface Tension Driven Microactuation Based on Continuous Electrow etting (CEW)", pp. 1-25, retrieved from the Internet: [http://cjmems.seas.ucla.edu/papers/Junghoon_jmem_2000_text.pdf] and Figures 1-14, retrieved from the Internet: [http://cjmems.seas.ucla.edu/papers /Junghoon_jmem_2000_figure.pdf].

Chang-Jin "CJ" Kim, "Mems Devices Based on the Use of Surface Tension", 4 pgs., retrieved from the Internet: [http://cjmems.seas.ucla.edu/papers/CJ_ISDRS_99.pdf].

Chang-Jin Kim, "Microfluids Using the Surface Tension Force in Microscale", Aug. 2000, Proc. SPIE vol. 4177, Abstract only.

* cited by examiner

MICRO-MIRROR DEVICE INCLUDING DIELECTROPHORETIC LIQUID

CROSS-REFERENCE TO RELATED APPLICATIONS

This application is a divisional of Ser. No. 10/387,312, filed Mar. 12, 2003, now U.S. Pat. No. 6,844,953 which is hereby incorporated by reference.

THE FIELD OF THE INVENTION

The present invention relates generally to micro-actuators, and more particularly to a micro-mirror device including a dielectrophoretic liquid.

BACKGROUND OF THE INVENTION

Micro-actuators have been formed on insulators or other substrates using micro-electronic techniques such as photolithography, vapor deposition, and etching. Such micro-actuators are often referred to as micro-electromechanical systems (MEMS) devices. An example of a micro-actuator includes a micro-mirror device. The micro-mirror device can be operated as a light modulator for amplitude and/or phase modulation of incident light. One application of a micro-mirror device is in a display system. As such, multiple micro-mirror devices are arranged in an array such that each micro-mirror device provides one cell or pixel of the display.

A conventional micro-mirror device includes an electrostatically actuated mirror supported for rotation about an axis of the mirror. Conventional micro-mirror devices, however, must be sufficiently sized to permit rotation of the mirror relative to supporting structure. Increasing the size of the micro-mirror device, however, reduces resolution of the display since fewer micro-mirror devices can occupy a given area. In addition, applied activation energies must be sufficiently large to generate a desired activation force on the mirror.

Accordingly, it is desired to minimize a size of a micro-mirror device so as to maximize the density of an array of such devices as well as increase an activation force on the micro-mirror device as generated by a given activation energy while minimizing the activation energy needed to generate the activation force on the micro-mirror device.

SUMMARY OF THE INVENTION

One aspect of the present invention provides a micro-mirror device. The micro-mirror device includes a substrate having a surface, and a plate spaced from and oriented substantially parallel to the surface of the substrate such that the plate and the surface of the substrate define a cavity therebetween. A dielectrophoretic liquid capable of movement when an electrical signal is applied to the micro-mirror device is disposed in the cavity, and a reflective element is interposed between the surface of the substrate and the plate such that the reflective element is adapted to move between a first position and at least one second position. The dielectrophoretic liquid includes at least one compound selected from the group consisting of siloxanes and silanes substantially free of asymmetrical ether linkages.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
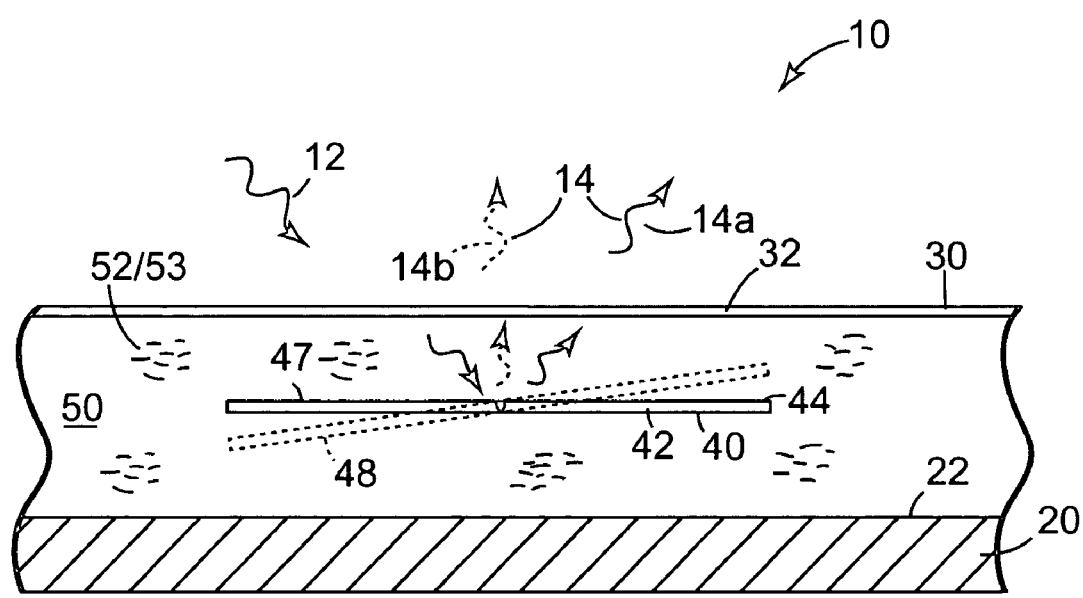
FIG. 1 is a schematic cross-sectional view illustrating one embodiment of a portion of a micro-mirror device according to the present invention.

FIG. 1 illustrates one embodiment of a micro-mirror device 10. Micro-mirror device 10 is a micro-actuator which relies on electrical to mechanical conversion to generate a force and cause movement or actuation of a body or element. In one embodiment, as described below, a plurality of micro-mirror devices 10 are arranged to form an array of micro-mirror devices. As such, the array of micro-mirror devices may be used to form a display. As such, each micro-mirror device 10 constitutes a light modulator for modulation of incident light and provides one cell or pixel of the display. In addition, micro-mirror device 10 may also be used in other imaging systems such as projectors and may also be used for optical addressing.

In one embodiment, micro-mirror device 10 includes a substrate 20, a plate 30, and an actuating element 40. Substrate 20 has a surface 22. In one embodiment, surface 22 is formed by a trench or tub formed in and/or on substrate 20. Preferably, plate 30 is oriented substantially parallel to surface 22 and spaced from surface 22 so as to define a cavity 50 therebetween. Actuating element 40 is interposed between surface 22 of substrate 20 and plate 30. As such, actuating element 40 is positioned within cavity 50.

In one embodiment, actuating element 40 is actuated so as to move between a first position 47 and a second position 48 relative to substrate 20 and plate 30. Preferably, actuating element 40 moves or tilts at an angle about an axis of rotation. As such, first position 47 of actuating element 40 is illustrated as being substantially horizontal and substantially parallel to substrate 20 and second position 48 of actuating element 40 is illustrated as being oriented at an angle to first position 47. Movement or actuation of actuating element 40 relative to substrate 20 and plate 30 is described in detail below.

In one embodiment, cavity 50 is filled with a dielectric liquid 52 such that actuating element 40 is in contact with dielectric liquid 52. In one embodiment, cavity 50 is filled with dielectric liquid 52 such that actuating element 40 is submerged in dielectric liquid 52. Dielectric liquid 52, therefore, is disposed between actuating element 40 and substrate 20 and between actuating element 40 and plate 30. Thus, dielectric liquid 52 contacts or wets opposite surfaces of actuating element 40. In another embodiment, cavity 50 is filled with dielectric liquid 52 such that actuating element 40 is positioned above dielectric liquid 52 and at least a surface of actuating element 40 facing substrate 20 is in contact with dielectric liquid 52. Dielectric liquid 52 enhances actuation of actuating element 40, as described below.

Preferably, dielectric liquid 52 is transparent. As such, dielectric liquid 52 is clear or colorless in the visible spectrum. In addition, dielectric liquid 52 is chemically stable in electric fields, chemically stable with changes in temperature, and chemically inert. In addition, dielectric liquid 52 has a low vapor pressure and is non-corrosive. Preferably, dielectric liquid 52 has a low viscosity. In one embodiment, suitable liquids have a viscosity of from about 0.5 centipoises to about 50 centipoises. Furthermore, dielectric liquid 52 has a high molecular orientation in electric fields and moves in an electric field.

Preferably, dielectric liquid 52 has a low dielectric constant and a high dipole moment. The dielectric constant of a material, also referred to as electrical permittivity, is a measure of the ability of a material to resist the formation of an electric field within it.

In one embodiment, dielectric liquid 52 is a dielectrophoretic liquid 53 including at least one compound selected from siloxanes which are substantially free of asymmetrical ether linkages and silanes which are substantially free of asymmetrical ether linkages. Asymmetrical ether linkages are those linkages between a silicon atom and an oxygen atom, where the oxygen atom is also linked to a carbon atom, i.e., Si—O—C. Suitable dielectrophoretic liquids, therefore, do not include such linkages.

Dielectrophoretic liquids useful herein include liquids which exhibit movement when an electric signal is applied thereto. Suitable dielectrophoretic liquids actually provide energy to contribute to the movement of actuating element 40 in micro-mirror device 10. More specifically, the molecules of the liquid polarize and then align in the electrical field and move, thus providing energy to move actuating element 40 of micro-mirror device 10.

Dielectrophoretic liquids useful as dielectric liquid 52 typically have a low dielectric constant, are flexible, and therefore compressible, in the small volumes used herein. The compressibility of the liquid relates to the flexibility of the molecules, and means that a liquid can change its conformation under a compressive force to slightly reduce its volume. Branching within the molecule also increases the compressibility. Compression of the liquid facilitates movement of the micro-mirror when an electric field is applied to the device. Compressible liquids exhibit at least a small movement when an electrical signal is applied to micro-mirror device 10. The compressible siloxane or silane containing liquids preferably have a dielectric constant of less than 20. Preferably, these liquids do not exhibit Joule heating, which may cause bubbles to form (i.e., outgassing) and can disrupt mirror movement.

In one embodiment, siloxane or silane containing liquids suitable for use as dielectrophoretic liquid 53 have a dielectric constant of less than 20. Preferably, dielectrophoretic liquid 53 is polarizable since polarizable liquids exhibit more movement when an electrical signal of a given voltage is applied compared to those liquids which are minimally polarizable or nonpolarizable. One example would be the difference in actuation voltage necessary when using toluene and benzene. Benzene is not polarizable whereas toluene is and, therefore, activates mirrors at approximately 50 percent of the voltage used with benzene. Thus, use of a polarizable liquid allows even smaller voltages to be used in micro-mirror device 10. This result of smaller voltages means that drive circuitry for micro-mirror device 10 can be incorporated into substrate 20. Thus, micro-mirror device 10 may be formed on a complimentary metal oxide semi-conductor (CMOS) structure.

In one embodiment, liquids suitable for use as dielectrophoretic liquid 53 include at least one compound selected from the group consisting of phenylmethyl siloxanes, methyl siloxanes, and silanes. Useful liquids include, but are not limited to, 3-phenyl heptamethyl trisiloxane, 1,1,5,5-tetraphenyl-1,3,3,5-tetramethyl trisiloxane, polydimethyl siloxane, polyphenylmethyl siloxane, phenyl-tris(trimethylsiloxy) silane, silanes with Si—O—Si backbones, and silanes with Si—C backbones, and mixtures thereof. Useful siloxanes and silanes have a flash point of at least about 60 degrees Centigrade; many such compounds have a flash point of at least about 100 degrees Centigrade. Useful siloxanes and silanes also have a melting point of about −20 degrees Centigrade or lower, as opposed to aromatic compounds which have melting points around 0 degrees Centigrade or higher. Ionic conductivity of useful siloxanes and silanes ranges from less than one up to about 100 pico(ohm-cm)$^{-1}$ or (pmho/cm), at 0.1 Hertz.

Non siloxy silanes which are substantially free of asymmetrical ether linkages (Si—O—C) in the backbones are also useful as dielectrophoretic liquids of the present invention.

Preferably, plate 30 is a transparent plate 32 and actuating element 40 is a reflective element 42. In one embodiment, transparent plate 32 is a glass plate. Other suitable planar translucent or transparent materials, however, may be used. Examples of such a material include quartz and plastic.

Reflective element 42 includes a reflective surface 44. In one embodiment, reflective element 42 is formed of a uniform material having a suitable reflectivity to form reflective surface 44. Examples of such a material include polysilicon or a metal such as aluminum. In another embodiment, reflective element 42 is formed of a base material such as polysilicon with a reflective material such as aluminum or titanium nitride disposed on the base material to form reflective surface 44. In addition, reflective element 42 may be formed of a non-conductive material or may be formed of or include a conductive material.

As illustrated in the embodiment of FIG. 1, micro-mirror device 10 modulates light generated by a light source (not shown) located on a side of transparent plate 32 opposite of substrate 20. The light source may include, for example, ambient and/or artificial light. As such, input light 12, incident on transparent plate 32, passes through transparent plate 32 into cavity 50 and is reflected by reflective surface 44 of reflective element 42 as output light 14. Thus, output light 14 passes out of cavity 50 and back through transparent plate 32.

The direction of output light 14 is determined or controlled by the position of reflective element 42. For example, with reflective element 42 in first position 47, output light 14 is directed in a first direction 14a. However, with reflective element 42 in second position 48, output light 14 is directed in a second direction 14b. Thus, micro-mirror device 10 modulates or varies the direction of output light 14 generated by input light 12. As such, reflective element 42 can be used to steer light into, and/or away from, an optical imaging system.

In one embodiment, first position 47 is a neutral position of reflective element 42 and represents an "ON" state of micro-mirror device 10 in that light is reflected, for example, to a viewer or onto a display screen, as described below. Thus, second position 48 is an actuated position of reflective element 42 and represents an "OFF" state of micro-mirror device 10 in that light is not reflected, for example, to a viewer or onto a display screen.

Figure 2:
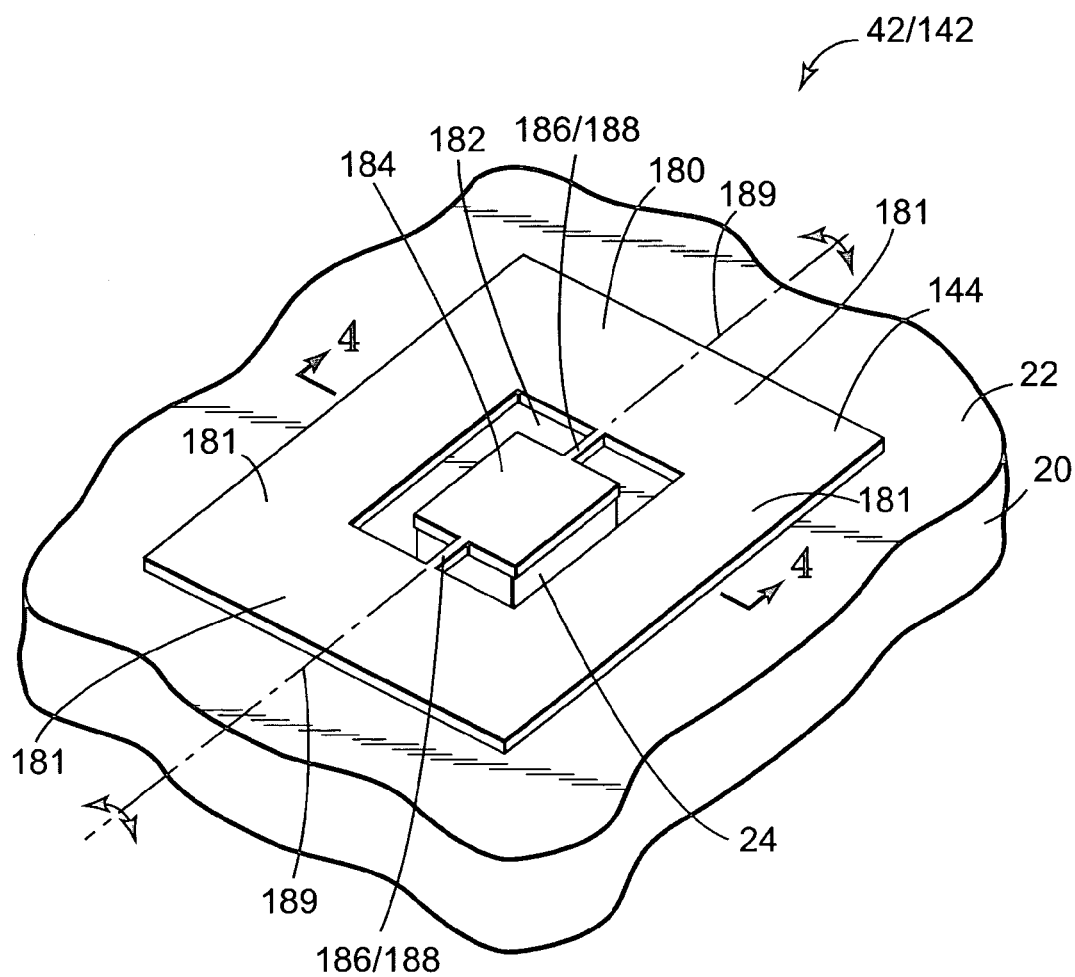
FIG. 2 is a perspective view illustrating one embodiment of a portion of a micro-mirror device according to the present invention.

FIG. 2 illustrates one embodiment of reflective element 42. Reflective element 142 has a reflective surface 144 and includes a substantially rectangular-shaped outer portion 180 and a substantially rectangular-shaped inner portion 184. In one embodiment, reflective surface 144 is formed on both outer portion 180 and inner portion 184. Outer portion 180 has four contiguous side portions 181 arranged to form a substantially rectangular-shaped opening 182. As such, inner portion 184 is positioned within opening 182. Preferably, inner portion 184 is positioned symmetrically within opening 182.

In one embodiment, a pair of hinges 186 extends between inner portion 184 and outer portion 180. Hinges 186 extend from opposite sides or edges of inner portion 184 to adjacent opposite sides or edges of outer portion 180. Preferably, outer portion 180 is supported by hinges 186 along an axis of symmetry. More specifically, outer portion 180 is supported about an axis that extends through the middle of opposed edges thereof. As such, hinges 186 facilitate movement of reflective element 142 between first position 47 and second position 48, as described above (FIG. 1). More specifically, hinges 186 facilitate movement of outer portion 180 between first position 47 and second position 48 relative to inner portion 184.

In one embodiment, hinges 186 include torsional members 188 having longitudinal axes 189 oriented substantially parallel to reflective surface 144. Longitudinal axes 189 are collinear and coincide with an axis of symmetry of reflective element 142. As such, torsional members 188 twist or turn about longitudinal axes 189 to accommodate movement of outer portion 180 between first position 47 and second position 48 relative to inner portion 184.

In one embodiment, reflective element 142 is supported relative to substrate 20 by a support or post 24 extending from surface 22 of substrate 20. More specifically, post 24 supports inner portion 184 of reflective element 142. As such, post 24 is positioned within side portions 181 of outer portion 180. Thus, outer portion 180 of reflective element 142 is supported from post 24 by hinges 186.

Figure 3:
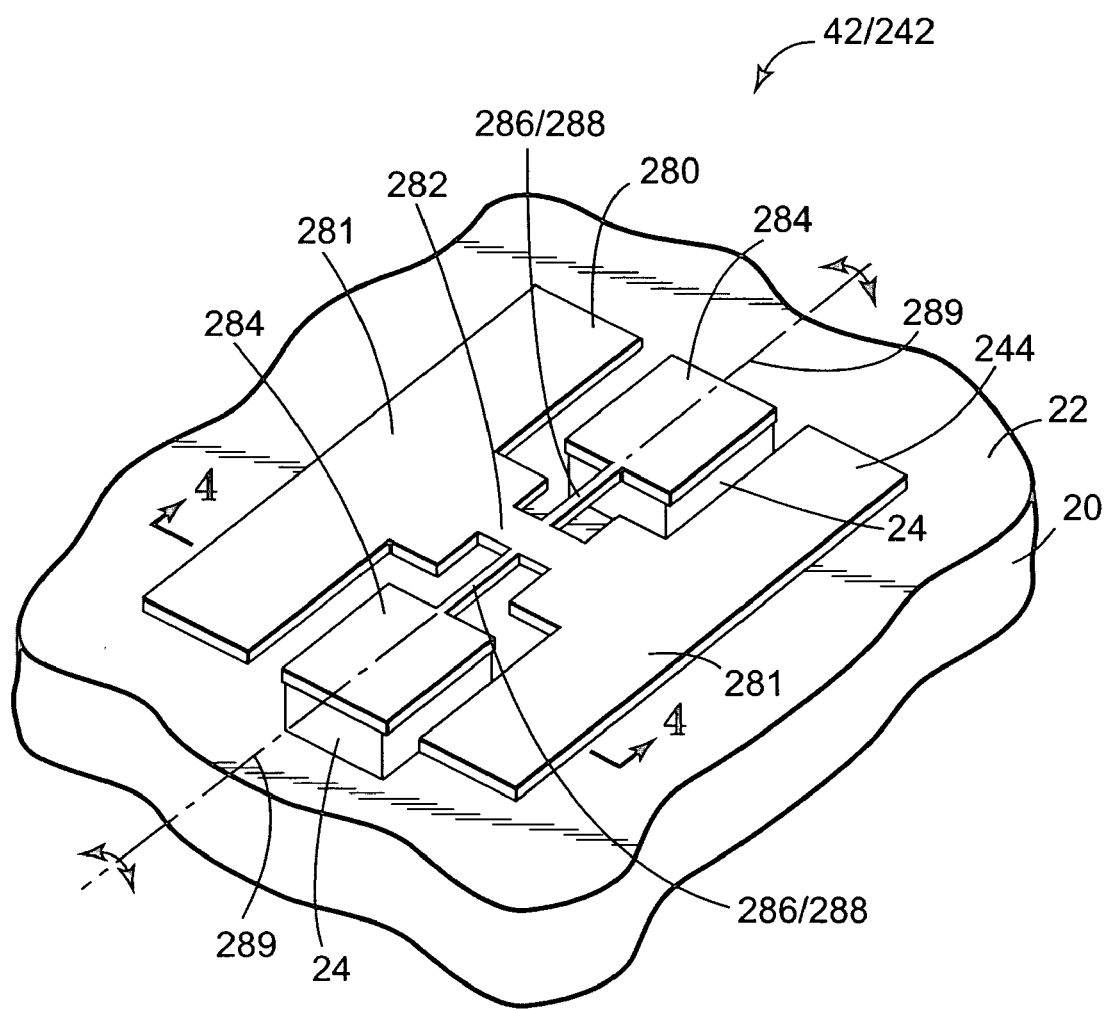
FIG. 3 is a perspective view illustrating another embodiment of a portion of a micro-mirror device according to the present invention.

FIG. 3 illustrates another embodiment of reflective element 42. Reflective element 242 has a reflective surface 244 and includes a substantially H-shaped portion 280 and a pair of substantially rectangular-shaped portions 284. In one embodiment, reflective surface 244 is formed on both H-shaped portion 280 and rectangular-shaped portions 284. H-shaped portion 280 has a pair of spaced leg portions 281 and a connecting portion 282 extending between spaced leg portions 281. As such, rectangular-shaped portions 284 are positioned on opposite sides of connection portion 282 between spaced leg portions 281. Preferably, rectangular-shaped portions 284 are positioned symmetrically to spaced leg portions 281 and connecting portion 282.

In one embodiment, hinges 286 extend between rectangular-shaped portions 284 and H-shaped portion 280. Hinges 286 extend from a side or edge of rectangular-shaped portions 284 to adjacent opposite sides or edges of connecting portion 282 of H-shaped portion 280. Preferably, H-shaped portion 280 is supported by hinges 286 along an axis of symmetry. More specifically, H-shaped portion 280 is supported about an axis that extends through the middle of opposed edges of connecting portion 282. As such, hinges 286 facilitate movement of reflective element 242 between first position 47 and second position 48, as described above (FIG. 1). More specifically, hinges 286 facilitate movement of H-shaped portion 280 between first position 47 and second position 48 relative to rectangular-shaped portions 284.

In one embodiment, hinges 286 include torsional members 288 having longitudinal axes 289 oriented substantially parallel to reflective surface 244. Longitudinal axes 289 are collinear and coincide with an axis of symmetry of reflective element 242. As such, torsional members 288 twist or turn about longitudinal axes 289 to accommodate movement of H-shaped portion 280 between first position 47 and second position 48 relative to rectangular-shaped portions 284.

In one embodiment, reflective element 242 is supported relative to substrate 20 by a pair of posts 24 extending from surface 22 of substrate 20. More specifically, posts 24 support rectangular-shaped portions 284 of reflective element 242. As such, posts 24 are positioned on opposite sides of connecting portion 282 between spaced leg portions 281.

Thus, H-shaped portion 280 of reflective element 242 is supported from posts 24 by hinges 286.

Figure 4:
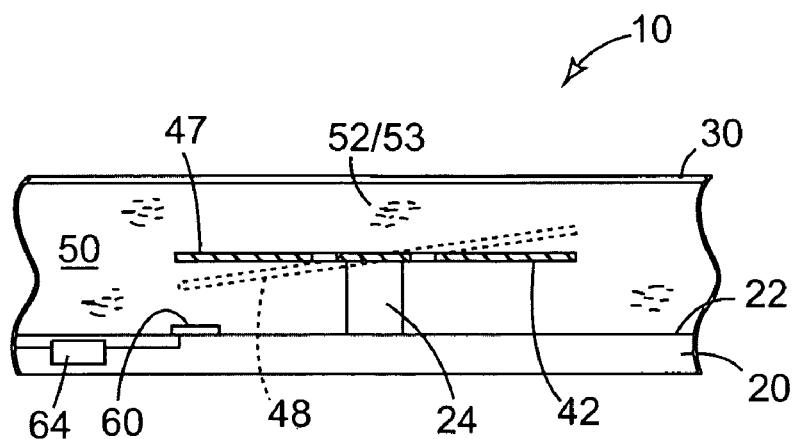
FIG. 4 is a schematic cross-sectional view taken along line 4—4 of FIGS. 2 and 3 illustrating one embodiment of actuation of the micro-mirror device according to the present invention.

FIG. 4 illustrates one embodiment of actuation of micro-mirror device 10. In one embodiment, reflective element 42 (including reflective elements 142 and 242) is moved between first position 47 and second position 48 by applying an electrical signal to an electrode 60 formed on substrate 20. Preferably, electrode 60 is formed on substrate 20 adjacent an end or edge of reflective element 42. Application of an electrical signal to electrode 60 generates an electric field between electrode 60 and reflective element 42 which causes movement of reflective element 42 between first position 47 and second position 48. In one embodiment, the electrical signal is applied to electrode 60 by drive circuitry 64.

As discussed above, preferably, dielectric liquid 52 includes a dielectrophoretic liquid 53 selected so as to respond to the electric field. More specifically, dielectrophoretic liquid 53 is selected such that the electric field aligns and moves polar molecules of the liquid. As such, dielectrophoretic liquid 53 moves in the electric field and contributes to the movement of reflective element 42 between first position 47 and second position 48 upon application of the electrical signal. Thus, with dielectrophoretic liquid 53 in cavity 50, dielectrophoretic liquid 53 enhances an actuation force acting on reflective element 42. More specifically, dielectrophoretic liquid 53 increases an actuation force on reflective element 42 as generated by a given activation energy.

By enhancing the actuation force acting on reflective element 42, dielectrophoretic liquid 53 allows lower activation energies to be applied for actuation of reflective element 42. For example, activation energies less than approximately 10 volts can be used. In one embodiment, voltage reduction is proportional to the dielectric constant of dielectrophoretic liquid 53 Because lower activation voltages can be used, drive circuitry 64 for micro-mirror device 10 can be incorporated into substrate 20. Thus, complimentary metal oxide semi-conductor (CMOS) structure can be used for substrate 20.

It is preferable that when such a dielectrophoretic liquid is used that electrode 60 have differing dimensions from reflective element 42. Thus, when an electric signal is applied to electrode 60, the electric field formed between electrode 60 and reflective element 42 will be a non-uniform electric field. This non-uniform electric field contributes to the dielectrophoretic force developed in cavity 50.

In one embodiment, dielectric/dielectrophoretic liquid 52,53 provides thermal management and/or cooling properties by dissipating heat developed within or absorbed by micro-mirror device 10. Heat may be developed within micro-mirror device 10 by movement of reflective element 42 and/or heat may be absorbed by micro-mirror device 10 by light impinged on reflective element 42.

In one embodiment, a passivation layer is formed on substrate 20 to protect or encapsulate drive circuitry 64. Thus, the passivation layer protects the integrity of drive circuitry 64 and prevents drive circuitry 64 from being attacked by dielectrophoretic liquid 53. In addition, the passivation layer reduces and/or prevents stiction, a friction-type force resulting from high Van der Waals forces, which may occur between reflective element 42 and electrode 60. While use of a dielectrophoretic liquid may reduce stiction occurring between reflective element 42 and electrode 60, compared to a micro-mirror wherein cavity 50 does not contain dielectrophoretic liquid, a passivation layer may still be beneficial because of the small, for example, one micron, distance between reflective element 42 and electrode 60 when reflective element 42 is in the second position. Materials suitable for the passivation layer include an insulator or dielectric material such as silicon nitride, silicon carbide and/or silicon oxide.

Preferably, when the electrical signal is removed from electrode 60, reflective element 42 persists or holds second position 48 for some length of time. Thereafter, restoring forces of reflective element 42 including, for example, hinges 186 (FIG. 2) and hinges 286 (FIG. 3) pull or return reflective element 42 to first position 47.

Figure 5:
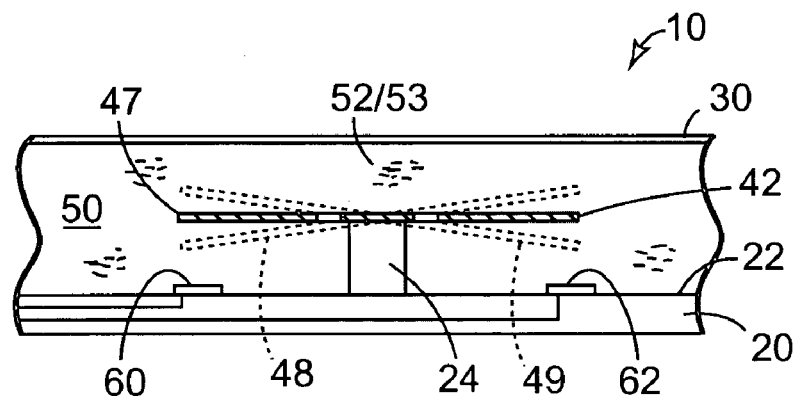
FIG. 5 is a schematic cross-sectional view similar to FIG. 4 illustrating another embodiment of actuation of the micro-mirror device according to the present invention.

FIG. 5 illustrates another embodiment of actuation of micro-mirror device 10. Similar to the embodiment illustrated in FIG. 4, reflective element 42 (including reflective elements 142 and 242) is moved between first position 47 and second position 48 by applying an electrical signal to electrode 60 formed on substrate 20 adjacent one end or edge of reflective element 42, as described above. As such, reflective element 42 is moved in a first direction.

However, in the embodiment illustrated in FIG. 5, reflective element 42 is also moved in a second direction opposite the first direction. More specifically, reflective element 42 is moved between first position 47 and a third position 49 oriented at an angle to first position 47 by applying an electrical signal to an electrode 62 formed on substrate 20 adjacent an opposite end or edge of reflective element 42. As such, reflective element 42 is moved in the second direction opposite the first direction by application of an electrical signal to electrode 62.

Application of the electrical signal to electrode 62 generates an electric field between electrode 62 and reflective element 42 which causes movement of reflective element 42 between first position 47 and third position 49 in a manner similar to how reflective element 42 moves between first position 47 and second position 48, as described above. It is also within the scope of the present invention for reflective element 42 to move directly between second position 48 and third position 49 without stopping or pausing at first position 47.

Figure 6:
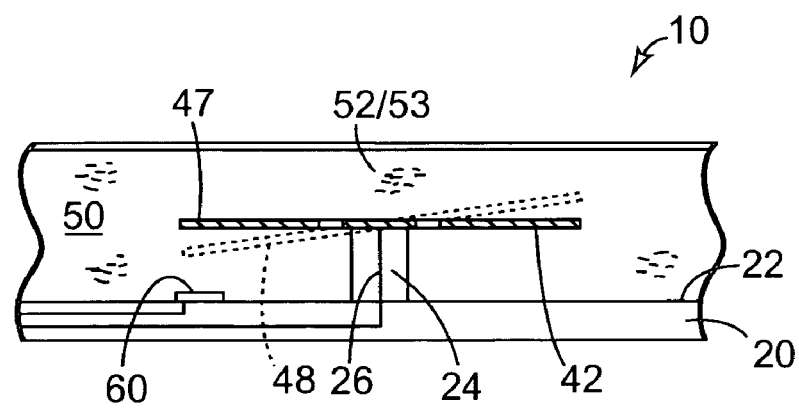
FIG. 6 is a schematic cross-sectional view similar to FIG. 4 illustrating another embodiment of actuation of the micro-mirror device according to the present invention.

FIG. 6 illustrates another embodiment of actuation of micro-mirror device 10. In one embodiment, a conductive via 26 is formed in and extends through post 24. Conductive via 26 is electrically coupled to reflective element 42 and, more specifically, conductive material of reflective element 42. As such, reflective element 42 (including reflective elements 142 and 242) is moved between first position 47 and second position 48 by applying an electrical signal to electrode 60 and reflective element 42. More specifically, electrode 60 is energized to one polarity and the conductive material of reflective element 42 is energized to an opposite polarity.

Application of an electrical signal of one polarity to electrode 60 and an electrical signal of an opposite polarity to reflective element 42 generates an electric field between electrode 60 and reflective element 42 which causes movement of reflective element 42 between first position 47 and second position 48. Dielectric liquid 52 (including dielectrophoretic liquid 53) contributes to the movement of reflective element 42, as described above.

In another embodiment, reflective element 42 (including reflective elements 142 and 242) is moved between first position 48 and second position 49 by applying an electrical signal to reflective element 42. More specifically, the electrical signal is applied to conductive material of reflective element 42 by way of conductive via 26 through post 24. As such, application of an electrical signal to reflective element 42 generates an electric field which causes movement of reflective element 42 between first position 48 and second position 49. Dielectric liquid 52 (including dielectrophoretic liquid 53) contributes to the movement of reflective element 42, as described above.

Figure 7:
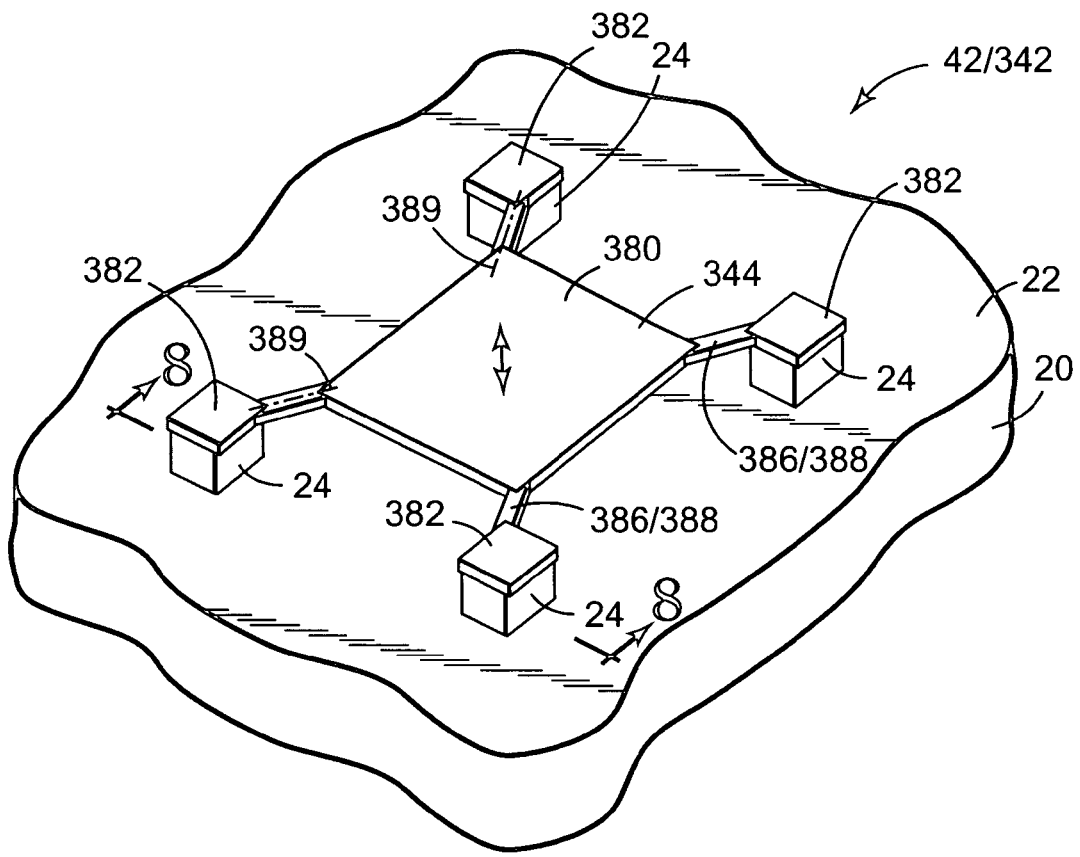
FIG. 7 is a perspective view illustrating another embodiment of a portion of a micro-mirror device according to the present invention.

FIG. 7 illustrates another embodiment of reflective element 42. Reflective element 342 has a reflective surface 344 and includes a substantially rectangular-shaped central portion 380 and a plurality of substantially rectangular-shaped portions 382. In one embodiment, reflective surface 344 is formed on central portion 380 and rectangular-shaped portions 382. Preferably, rectangular-shaped portions 382 are positioned at corners of central portion 380.

Figure 8:
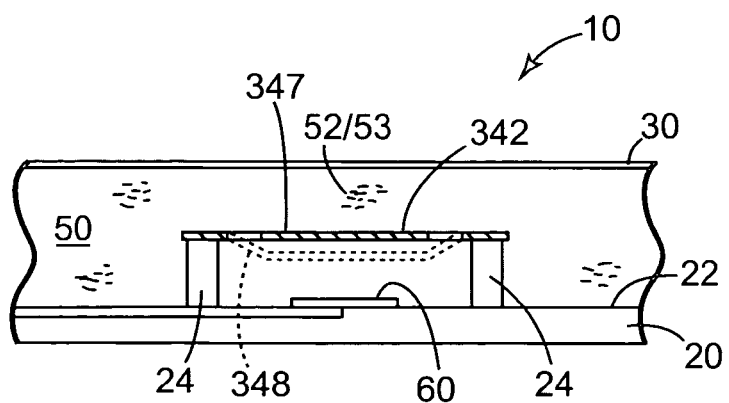
FIG. 8 is a schematic cross-sectional view taken along line 8—8 of FIG. 7 illustrating one embodiment of actuation of the micro-mirror device according to the present invention.

In one embodiment, hinges 386 extend between rectangular-shaped portions 382 and central portion 380. Hinges 386 extend from a side or edge of rectangular-shaped portions 382 to adjacent sides or edges of sides or edges of central portion 380. Preferably, central portion 380 is supported by hinges 386 along diagonal axes of symmetry. More specifically, central portion 380 is supported about axes that extend between opposite corners of central portion 380. As such, hinges 386 facilitate movement of reflective element 342 between a first position 347 and a second position 348, as described below (FIG. 8). More specifically, hinges 386 facilitate movement of central portion 380 between first position 347 and second position 348 relative to rectangular-shaped portions 382.

In one embodiment, hinges 386 include flexure members 388 having longitudinal axes 389 oriented substantially parallel to reflective surface 344. Longitudinal axes 389 extend between opposite corners of and intersect at a center of central portion 380. As such, flexure members 388 bend along longitudinal axes 389 to accommodate movement of central portion 380 between first position 347 and second position 348 relative to rectangular-shaped portions 382.

In one embodiment, reflective element 342 is supported relative to substrate 20 by a plurality of posts 24 extending from surface 22 of substrate 20. More specifically, posts 24 support rectangular-shaped portions 382 of reflective element 342. As such, posts 24 are positioned at corners of central portion 380. Thus, central portion 380 of reflective element 342 is supported from posts 24 by hinges 386.

FIG. 8 illustrates one embodiment of actuation of micro-mirror device 10 including reflective element 342. In one embodiment, reflective element 342 is actuated so as to move between first position 347 and second position 348 relative to substrate 20 and plate 30. Preferably, reflective element 342 moves in a direction substantially perpendicular to surface 22 of substrate 20. As such, first position 347 and second position 348 of reflective element 342 are both illustrated as being substantially horizontal and parallel to each other.

In one embodiment, reflective element 342 is moved between first position 347 and second position 348 by applying an electrical signal to electrode 60 formed on substrate 20. Preferably, electrode 60 is formed on substrate 20 so as to be located centrally under reflective element 342. Application of an electrical signal to electrode 60 generates an electric field between electrode 60 and reflective element 342 which causes movement of reflective element 342 between first position 347 and second position 348.

Preferably, when the electrical signal is removed from electrode 60, reflective element 342 persists or holds second position 348 for some length of time. Thereafter, restoring forces of reflective element 342 including, for example, hinges 386 pull or return reflective element 342 to first position 347.

Figure 9:
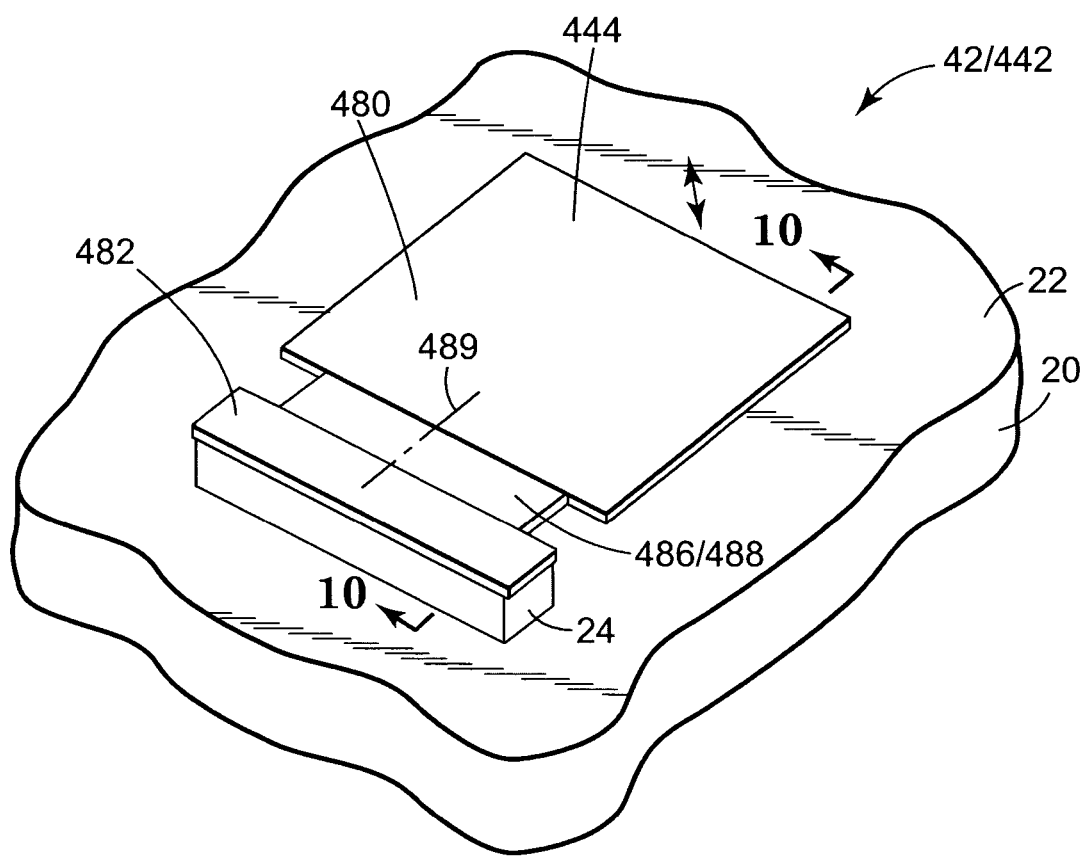
FIG. 9 is a perspective view illustrating another embodiment of a portion of a micro-mirror device according to the present invention.

FIG. 9 illustrates another embodiment of reflective element 42. Reflective element 442 has a reflective surface 444 and includes a first substantially rectangular-shaped portion 480 and a second substantially rectangular-shaped portion 482. In one embodiment, reflective surface 444 is formed on both rectangular-shaped portions 480 and 482. Second rectangular-shaped portion 482 is positioned along a side of first rectangular-shaped portion 480.

In one embodiment, a hinge 486 extends between rectangular-shaped portion 482 and rectangular-shaped portion 480. Hinge 486 extends from a side or edge of rectangular-shaped portion 482 to an adjacent side or edge of rectangular-shaped portion 480. As such, rectangular-shaped portion 480 is supported in a cantilever manner along one side or edge thereof. Thus, hinge 486 facilitates movement of reflective element 442 between a first position 447 and a second position 448, as described below (FIG. 10). More specifically, hinge 486 facilitates movement of rectangular-shaped portion 480 between first position 447 and second position 448 relative to rectangular-shaped portion 482.

In one embodiment, hinge 486 includes a flexure member 488 having an axis 489 oriented substantially parallel to reflective surface 444. As such, flexure member 488 bends along axis 489 to accommodate movement of rectangular-shaped portion 480 between first position 447 and second position 448 relative to rectangular-shaped portion 482. While flexure member 488 is illustrated as being one member, it is within the scope of the present invention for flexure member 488 to include a plurality of spaced members.

In one embodiment, reflective element 442 is supported relative to substrate 20 by post 24 extending from surface 22 of substrate 20. More specifically, post 24 supports substantially rectangular-shaped portion 482 of reflective element 442. As such, post 24 is positioned to a side of rectangular-shaped portion 480. Thus, rectangular-shaped portion 480 of reflective element 442 is supported from post 24 by hinge 486. While post 24 is illustrated as being one post, it is within the scope of the present invention for post 24 to include a plurality of spaced posts. In addition, positioning of post 24 on a side of rectangular-shaped portion 480 includes positioning of post 24 at a corner of rectangular-shaped portion 480.

Figure 10A:
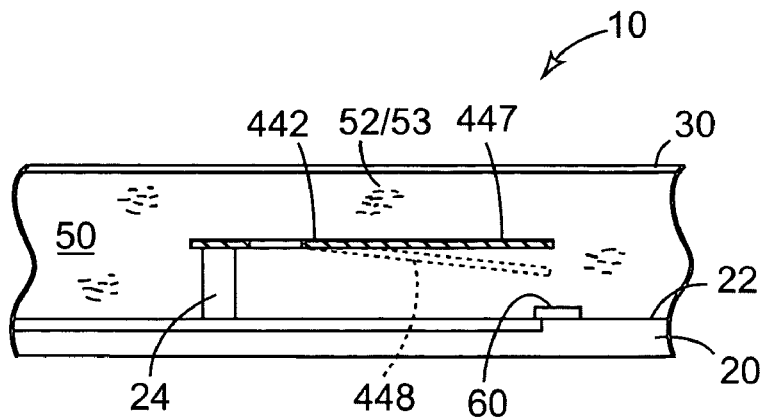
FIG. 10A is a schematic cross-sectional view taken along line 10—10 of FIG. 9 illustrating one embodiment of actuation of the micro-mirror device according to the present invention.

FIG. 10A illustrates one embodiment of actuation of micro-mirror device 10 including reflective element 442. In one embodiment, reflective element 442 is actuated so as to move between first position 447 and second position 448 relative to substrate 20 and plate 30. Preferably, reflective element 442 moves in a direction toward surface 22 of substrate 20.

In one embodiment, reflective element 442 is moved between first position 447 and second position 448 by applying an electrical signal to electrode 60 formed on substrate 20. Preferably, electrode 60 is formed on substrate 20 adjacent an end or edge of reflective element 442. Application of an electrical signal to electrode 60 generates an electric field between electrode 60 and reflective element 442 which causes movement of reflective element 442 between first position 447 and second position 448.

Preferably, when the electrical signal is removed from electrode 60, reflective element 442 persists or holds second position 448 for some length of time. Thereafter, restoring forces of reflective element 442 including, for example, hinge 486 pulls or returns reflective element 442 to first position 447.

Figure 10B:
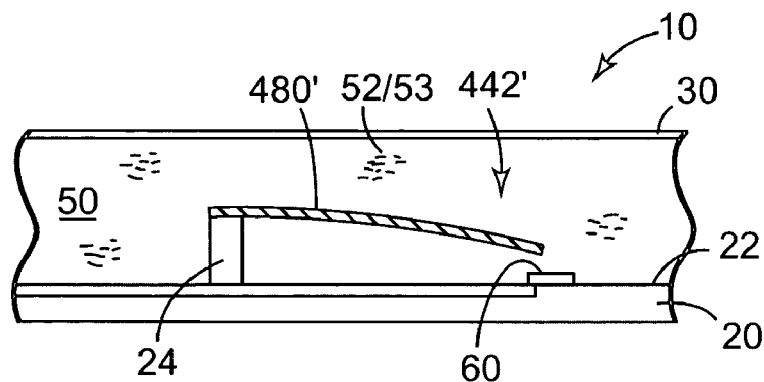
FIG. 10B is a schematic cross-sectional view similar to FIG. 10A illustrating actuation of another embodiment of a micro-mirror device according to the present invention.
Figure 10C:
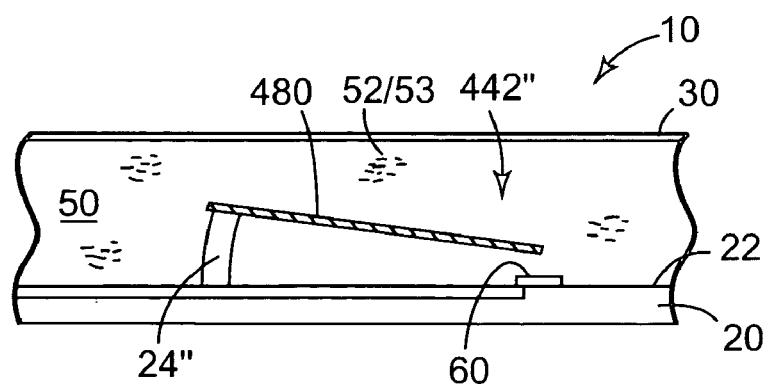
FIG. 10C is a schematic cross-sectional view similar to FIG. 10A illustrating actuation of another embodiment of a micro-mirror device according to the present invention.

FIGS. 10B and 10C illustrate additional embodiments of actuation of micro-mirror device 10 including additional embodiments of reflective element 442. In the embodiment illustrated in FIG. 10B, reflective element 442' includes a substantially rectangular-shaped portion 480' supported directly by post 24. Rectangular-shaped portion 480' is flexible and post 24 is substantially rigid such that rectangular-shaped portion 480' flexes during actuation. In the embodiment illustrated in FIG. 10C, reflective element 442" includes substantially rectangular-shaped portion 480 supported directly by post 24". Rectangular-shaped portion 480 is substantially rigid and post 24" is flexible such that post 24" flexes during actuation. While substantially rectangular-shaped portion 480 (including rectangular-shaped portion 480') and post 24 (including post 24") are illustrated as separate members, it is within the scope of the present invention for rectangular-shaped portion 480 and post 24 to be integrally formed as one unitary member.

Figure 11:
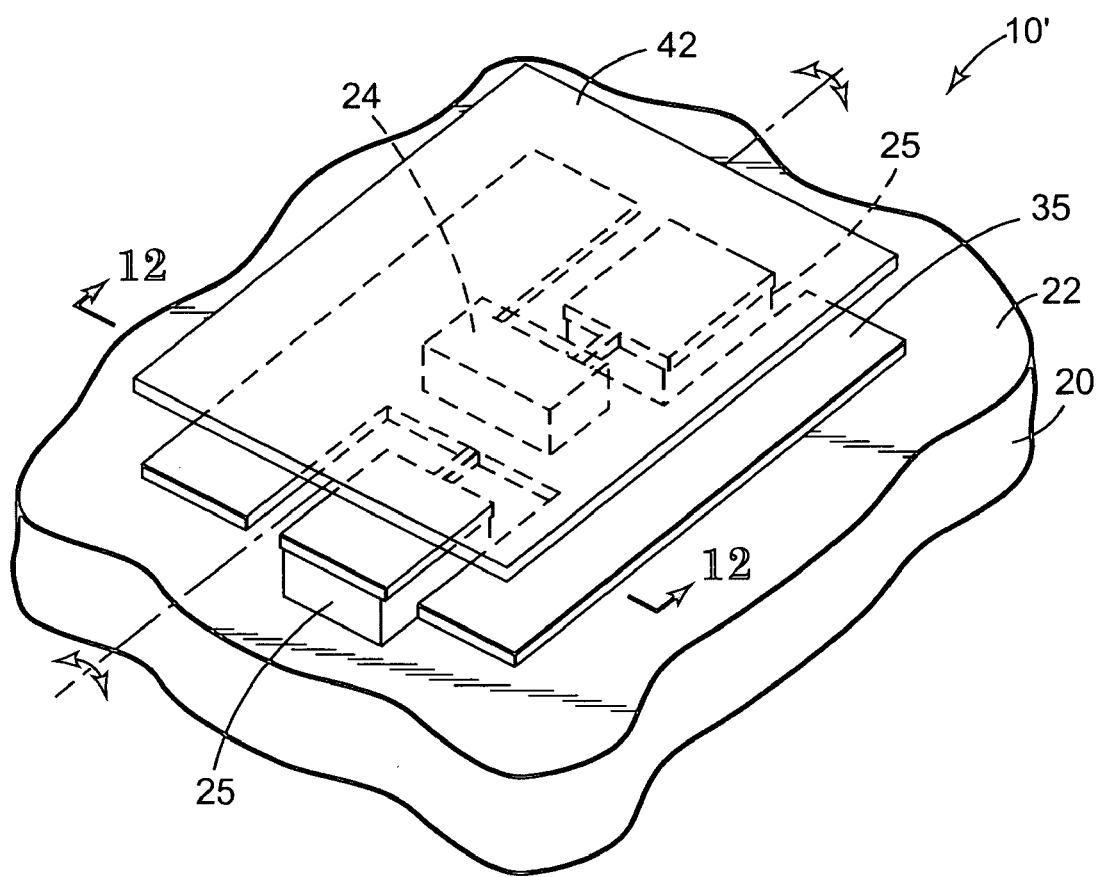
FIG. 11 is a perspective view illustrating another embodiment of a portion of a micro-mirror device according to the present invention.
Figure 12:
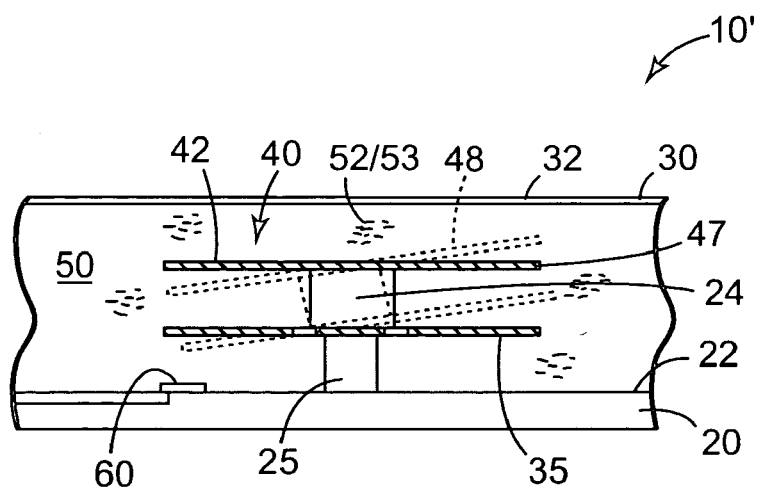
FIG. 12 is a schematic cross-sectional view taken along line 12—12 of FIG. 11 illustrating one embodiment of actuation of the micro-mirror device according to the present invention.

FIGS. 11 and 12 illustrate another embodiment of micro-mirror device 10. Micro-mirror device 10' is similar to micro-mirror device 10 and includes substrate 20, plate 30, and actuating element 40 with cavity 50 defined between substrate 20 and plate 30. As such, cavity 50 is filled with dielectric/dielectrophoretic liquid 52,53, as described above. Micro-mirror device 10', however, includes a driver plate 35 interposed between substrate 20 and actuating element 40.

Preferably, plate 30 is transparent plate 32 and actuating element 40 is reflective element 42. In addition, reflective element 42 is supported relative to substrate 20 by post 25. Post 25, however, extends from driver plate 35. As such, in one embodiment, driver plate 35 is supported relative to substrate 20 by posts 25 extending from surface 22 of substrate 20.

Actuation of micro-mirror device 10' is similar to that of micro-mirror device 10, as described above, with the exception that both driver plate 35 and reflective element 42 are actuated. As such, driver plate 35 and reflective element 42 are both moved between first position 47 and second position 48 by applying an electrical signal to electrode 60 formed on substrate 20. Application of an electrical signal to electrode 60 generates an electric field between electrode 60 and driver plate 35 and/or reflective element 42 which causes movement of driver plate 35 and reflective element 42 between first position 47 and second position 48.

Figure 13:
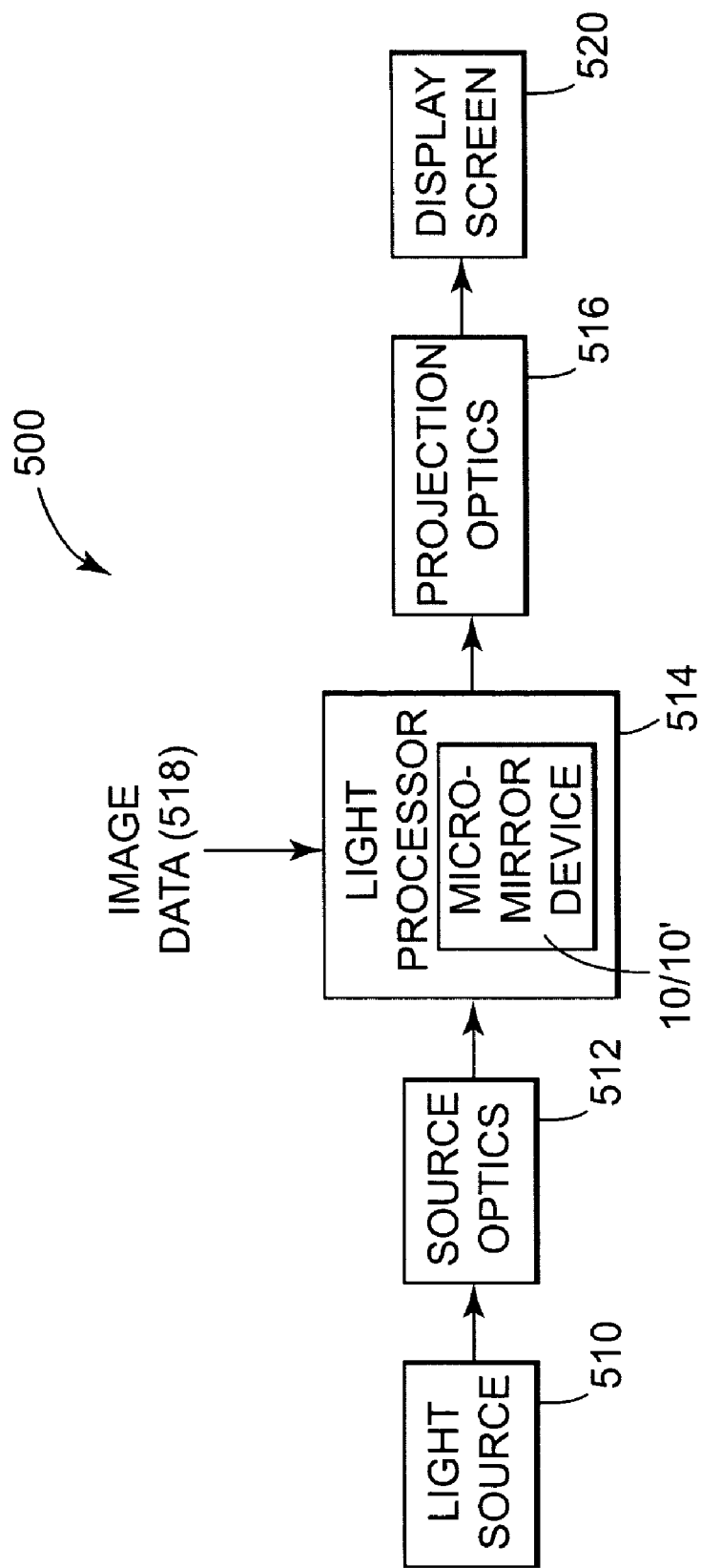
FIG. 13 is a block diagram illustrating one embodiment of a display system including a micro-mirror device according to the present invention.

In one embodiment, as illustrated in FIG. 13, micro-mirror device 10 (including micro-mirror device 10') is incorporated in a display system 500. Display system 500 includes a light source 510, source optics 512, a light processor or controller 514, and projection optics 516. Light processor 514 includes multiple micro-mirror devices 10 arranged in an array such that each micro-mirror device 10 constitutes one cell or pixel of the display. The array of micro-mirror devices 10 may be formed on a common substrate with separate cavities and/or a common cavity for the reflective elements of the multiple micro-mirror devices 10.

In one embodiment, light processor 514 receives image data 518 representing an image to be displayed. As such, light processor 514 controls the actuation of micro-mirror devices 10 and the modulation of light received from light source 510 based on image data 518. The modulated light is then projected to a viewer or onto a display screen 520.

Figure 14:
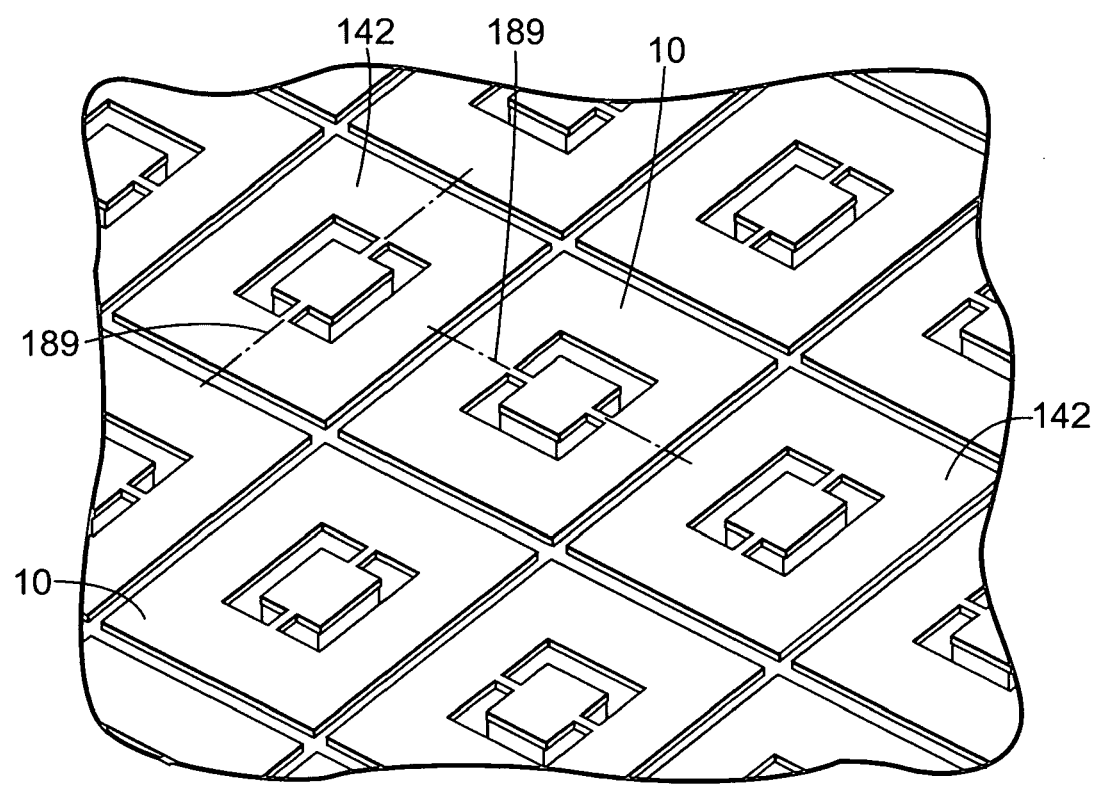
FIG. 14 is a perspective view illustrating one embodiment of a portion of an array of micro-mirror devices according to the present invention.

FIG. 14 illustrates one embodiment of an array of micro-mirror devices 10. Micro-mirror devices 10 include reflective elements-142, as illustrated in FIG. 2 and described above. Preferably, adjacent reflective elements 142 are rotated such that longitudinal axes 189 of one reflective element 142 extend in a first direction and longitudinal axes 189 of an adjacent reflective element 142 extend in a second direction oriented substantially perpendicular to the first direction.

Figure 15:
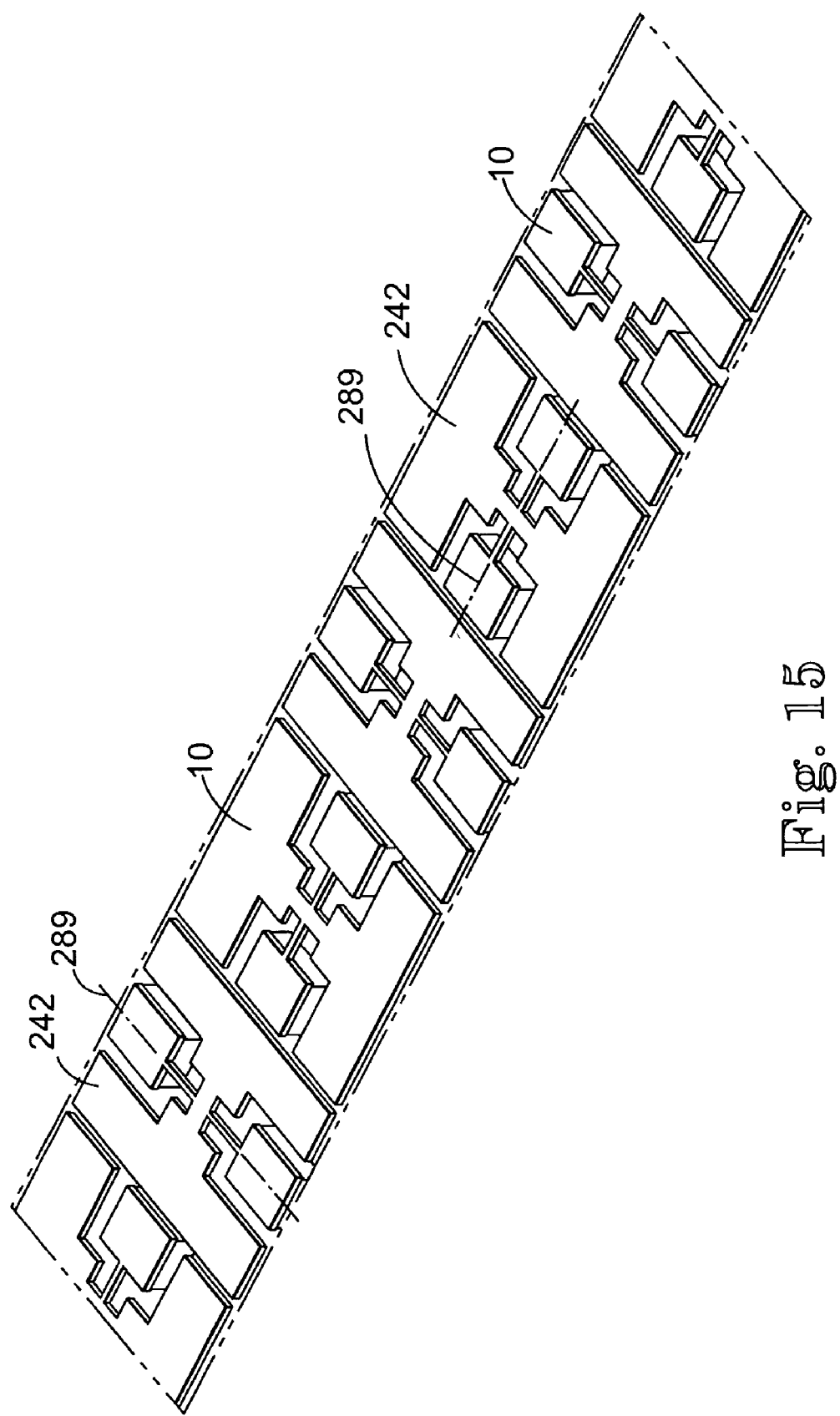
FIG. 15 is a perspective view illustrating another embodiment of a portion of an array of micro-mirror devices according to the present invention.

FIG. 15 illustrates another embodiment of an array of micro-mirror devices 10. Micro-mirror devices 10 include reflective elements 242, as illustrated in FIG. 3 and described above. Preferably, adjacent reflective elements 242 are rotated such that longitudinal axes 289 of one reflective element 242 extend in a first direction and longitudinal axes 289 of an adjacent reflective element 242 extend in a second direction oriented substantially perpendicular to the first direction. By rotating adjacent reflective elements 142 or 242 when forming an array of micro-mirror devices 10, fluidic cross coupling or cross-talk between adjacent reflective elements is avoided.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

EXAMPLES

Examples 2, 5, 9, and 10

Comparative Examples C1, C3, C4, C6, C7, and C8

In one exemplary embodiment, several liquids were screened for an ability to assist in mirror movement of a micro-mirror device. As can be seen in Table 1, siloxanes and silanes which do not have asymmetrical ether linkages (examples 2, 5, 9, and 10) move the mirror of the micro-mirror device. These siloxanes and silanes also have ionic conductivities of less than about 100 pmho/cm, and dielectric constants below about 20. Liquids which have asymmetrical ether linkages (comparative examples C1, C3, C4, C6, C7, and C8), however, do not move the mirror of the micro-mirror device. In addition, such liquids exhibit high dielectric constants and high ionic conductivity values.

TABLE 1

| Ex. | Liquid | Dielectric Constant | Ionic Conductivity pmho/cm | Moves Mirror |
|---|---|---|---|---|
| C1 | (3,3,3-Trifluoropropyl)trimethoxysilane | 10715.6 | 1054.3 | N |
| 2 | Phenyltris(trimethylsiloxy)silane | 3.0 | 0.95 | Y |
| C3 | Phenyltriethoxysilane | 95.3 | 60.0 | N |
| C4 | Phenyltrimethoxysilane | 5179.5 | 1299.5 | N |
| 5 | 3-Phenylheptamethyltrisiloxane | 2.6 | 0.13 | Y |
| C6 | 3-Cyanopropyltriethoxysilane | 649273 | 27714.0 | N |
| C7 | 3-Chloropropyltrimethoxysilane | 1043938 | 71130.5 | N |
| C8 | 3-Chloropropyltriethoxysilane | 259664 | 34219.9 | N |
| 9 | Polydimethylsiloxane | 2.4 | 0.02 | Y |
| 10 | Polyphenylmethylsiloxane | 3.1 | 0.41 | Y |

What is claimed is:

1. A micro-actuator, comprising:
    a substrate having a surface;
    a plate spaced from and oriented substantially parallel to the surface of the substrate, the plate and the surface of the substrate defining a cavity therebetween;
    a dielectrophoretic liquid disposed in the cavity and capable of movement when an electrical signal is applied to the micro-actuator, the dielectrophoretic liquid including at least one compound selected from the group consisting of siloxanes substantially free of asymmetrical ether linkages and silanes substantially free of asymmetrical ether linkages; and
    an actuating element interposed between the surface of the substrate and the plate,
    wherein the actuating element is adapted to move between a first position and at least one second position.

2. A micro-actuator according to claim 1, wherein the dielectrophoretic liquid has a dielectric constant of less than about 20.

3. A micro-actuator according to claim 1, wherein the dielectrophoretic liquid has a flashpoint greater than about 60 degrees Centigrade.

4. A micro-actuator according to claim 1, wherein the dielectrophoretic liquid has an ionic conductivity of less than about 100 pmho/cm at 0.1 Hertz.

5. A micro-actuator according to claim 1, wherein the dielectrophoretic liquid has a viscosity of about 0.5 centipoises to about 50 centipoises.

6. A micro-actuator according to claim 1, wherein the dielectrophoretic liquid includes at least one compound selected from the group consisting of phenylmethyl siloxanes, methyl siloxanes, and silanes.

7. A micro-actuator according to claim 1, wherein the dielectrophoretic liquid includes at least one compound selected from 3-phenyl heptamethyl trisiloxane, 1,1,5,5-tetraphenyl-1,3,3,5-tetramethyl trisiloxane, polydimethylsiloxane, polyphenylmethylsiloxane, phenyl-tris(trimethylsiloxy) silane, silanes having Si—O—Si backbones, and silanes having Si—C backbones.

8. A micro-actuator according to claim 1, wherein the dielectrophoretic liquid comprises at least one silane having a backbone substantially free of asymmetrical ether linkages.

9. A micro-actuator according to claim 1, wherein the actuating element is at least one of positioned above the dielectrophoretic liquid and submerged in the dielectrophoretic liquid.

10. A micro-actuator according to claim 1, further comprising:
    at least one electrode formed on the surface of the substrate, the electrode having differing dimensions from the actuating element,
    wherein the actuating element is adapted to move in response to application of an electrical signal to the at least one electrode and the electrical signal is adapted to form a non-uniform electric field in the cavity.

11. A micro-actuator according to claim 1, wherein the dielectrophoretic liquid is adapted to increase an actuation force on the actuating element as generated by a given activation energy.

12. A method of using a dielectrophoretic liquid in a micro-actuator including an actuator element adapted to move between a first position and at least one second position, the method comprising:
    disposing the dielectrophoretic liquid in a cavity of the micro-actuator, including at least one of positioning the actuator element above and submerging the actuator element in the dielectrophoretic liquid; and
    moving the actuator element between the first position and the least one second position, including applying an electrical signal to the micro-actuator,
    wherein the dielectrophoretic liquid includes at least one compound selected from the group consisting of siloxanes substantially free of asymmetrical ether linkages and silanes substantially free of asymmetrical ether linkages, and
    wherein the dielectrophoretic liquid exhibits movement when the electrical signal is applied to the micro-actuator and the movement contributes to the moving of the actuator element between the first position and the at least one second position.

13. A method of using a dielectrophoretic liquid according to claim 12, wherein the dielectrophoretic liquid has a dielectric constant of less than about 20.

14. A method of using a dielectrophoretic liquid according to claim 12, wherein the dielectrophoretic liquid is compressible.

15. A method of using a dielectrophoretic liquid according to claim 12, wherein the dielectrophoretic liquid is polarizable.

16. A method of using a dielectrophoretic liquid according to claim 12, wherein the dielectrophoretic liquid is substantially transparent.

17. A method of using a dielectrophoretic liquid according to claim 12, wherein the dielectrophoretic liquid has a flashpoint greater than about 60 degrees Centigrade.

18. A method of using a dielectrophoretic liquid according to claim 12, wherein the dielectrophoretic liquid has an ionic conductivity of less than about 100 pmho/cm at 0.1 Hertz.

19. A method of using a dielectrophoretic liquid according to claim 12, wherein the dielectrophoretic liquid has a viscosity of about 0.5 centipoises to about 50 centipoises.

20. A method of using a dielectrophoretic liquid according to claim 12, wherein the dielectrophoretic liquid includes at least one compound selected from the group consisting of phenylmethyl siloxanes, methyl siloxanes, and silanes.

21. A method of using a dielectrophoretic liquid according to claim 12, wherein the dielectrophoretic liquid includes at least one compound selected from 3-phenyl heptamethyl trisiloxane, 1,1,5,5-tetraphenyl-1,3,3,5-tetramethyl trisiloxane, polydimethylsiloxane, polyphenylmethylsiloxane, phenyl-tris(trimethylsiloxy) silane, silanes having Si—O—Si backbones, and silanes having Si—C backbones.

* * * * *